US006650200B2

(12) United States Patent
Culliton et al.

(10) Patent No.: US 6,650,200 B2
(45) Date of Patent: Nov. 18, 2003

(54) DYNAMIC COMBINER/SPLITTER FOR RF SIGNAL SYSTEMS

(75) Inventors: Brian E. Culliton, DeWitt, NY (US); Jeffrey C. Merrill, Manlius, NY (US)

(73) Assignee: Anaren Microwave, Inc., East Syracuse, NY (US)

( * ) Notice: Subject to any disclaimer, the term of this patent is extended or adjusted under 35 U.S.C. 154(b) by 0 days.

(21) Appl. No.: 10/125,203

(22) Filed: Apr. 18, 2002

(65) Prior Publication Data

US 2003/0090337 A1 May 15, 2003

Related U.S. Application Data

(60) Provisional application No. 60/285,530, filed on Apr. 20, 2001.

(51) Int. Cl.[7] .................................................. H03H 7/38

(52) U.S. Cl. .......................... 333/124; 333/100; 330/54

(58) Field of Search ........................ 330/51, 53, 54–57, 330/286, 295, 124 R, 126, 124 D, 125; 333/100, 101, 109–114, 124–126, 128, 136

(56) References Cited

U.S. PATENT DOCUMENTS

| | | | | |
|---|---|---|---|---|
| 4,315,222 A | | 2/1982 | Saleh | 330/124 D |
| 5,304,943 A | * | 4/1994 | Koontz | 330/51 |
| 5,414,387 A | * | 5/1995 | Nakahara et al. | 330/54 |
| 5,754,082 A | * | 5/1998 | Swanson | 333/124 |
| 5,867,060 A | * | 2/1999 | Burkett et al. | 330/2 |
| 5,872,491 A | | 2/1999 | Kim et al. | 331/101 |
| 5,942,804 A | | 8/1999 | Mohwinkel et al. | 257/778 |
| 6,008,694 A | | 12/1999 | El-Sharawy | 330/54 |
| 6,127,887 A | | 10/2000 | Cho | 330/124 R |
| 6,215,359 B1 | | 4/2001 | Peckham et al. | 330/302 |
| 6,252,871 B1 | | 6/2001 | Posner et al. | 370/360 |

OTHER PUBLICATIONS

George L. Matthae; Leo Young; E.M.T. Jones; "Microwave Filters, Impedance–Matching Networks, and Coupling Structures"; Artech House, Inc.; Copyright 1980; p. 223.

* cited by examiner

*Primary Examiner*—Minh Nguyen
(74) *Attorney, Agent, or Firm*—Bond, Schoeneck & King, PLLC

(57) ABSTRACT

A circuit for dynamically combining/splitting power amplifier outputs having at least four power input ports. The input ports are joined by a 360 degree transmission line having three switches spaced 90 degrees apart. Two coupled line circuits are connected to the transmission line. The coupled line circuits are placed in parallel and each of the coupled line circuits selectively provides either 50 Ohms or 70.7 Ohms impedance.

4 Claims, 5 Drawing Sheets

DYNAMIC COMBINER/SPLITTER FOR RF SIGNAL SYSTEMS

CROSS REFERENCE

Cross-reference is made to provisional application, U.S. Patent Application No. 60/285,530 entitled "Dynamic Coupler," filed on Apr. 20, 2001, the entire disclosure of which is hereby incorporated by reference.

FIELD OF THE INVENTION

The present invention relates to combining and/or splitting high power, high frequency RF signals and, more particularly, to a device for dynamically combining or splitting high power, high frequency RF signals.

BACKGROUND OF THE INVENTION

Wireless communication infrastructures include high power RF signal systems in which it is desirable to combine signals of the various input lines having coherent sources with little or no insertion loss, regardless of how many of the inputs are selected at any one time. For example, a common cellular base station includes systems that utilize from one to four amplifiers. Usually it is a requirement that all amplifier outputs be equal in magnitude and have the same phase. The system must support any combination of one to four in any possible combination of amplifier positions. In addition, the system must be able to reconfigure to maintain optimum performance when one or more amplifiers fail. In typical wireless communication systems, the system would preferably act as a piece of 50 Ohm transmission line, or a two way combiner, or a three way combiner, or a four way combiner with the inputs being able to connect to any available combination of amplifier locations.

There are known to those skilled in the art various methods of achieving some of these demands. For instance, U.S. Pat. No. 4,315,222 to Saleh describes an N-way non-hybrid power combiner arrangement for microwave amplifiers. The Saleh patent describes the use of sensing means that are coupled in one-to-one relationships with the individual amplifiers to monitor amplifier performance and/or failure. The method utilizes shorting devices that are disposed adjacent to the outputs of the individual amplifiers and are coupled to the associated sensing means in a one-to-one relationship. Upon identifying amplifier failure, the sensing means coupled to that particular amplifier activates either its associated short-circuiting or open-circuiting device, which in turn uncouples the failed amplifier and the transmission line associated therewith.

An additional method of achieving some of the demands of high frequency wireless communication systems is described in U.S. Pat. No. 6,252,871 to Posner et al. which describes an apparatus for either combining a plurality of high frequency RF signal inputs or splitting a single RF frequency input into a plurality of RF signal outputs that employs a switchable combining/splitting section and a switchable matching section. The switchable combining/splitting section operates to either combine the RF signal inputs to a common summed output or to take a matched input and to split it into a plurality of elements. The matching section operates to switchably match the impedance presented by the combining/splitting section to achieve a minimum or zero insertion loss through the apparatus.

Although the prior art contains some methods to overcome the problems associated with wireless communication infrastructure as described above, there is still a need for a simple and relatively inexpensive system that allows dynamically combining amplifiers in wireless communication systems.

SUMMARY OF THE INVENTION

One object of the claimed invention is to provide adjustable impedance with a fixed length quarter-wave transmission line or equivalent transformer.

It is another object of this invention to provide a method of combining transformer impedances and replacing it with a single transformer.

It is yet another object of this invention to provide increasing performance by reducing the complexity of amplifier circuitry.

It is a further object of this invention to use coupled line circuitry to create switchable impedance in order to increase the performance of a wireless communication system.

These and other goals are accomplished by providing a circuit for dynamically combining/splitting power amplifier outputs that comprises four power input ports. The input ports are joined by a 360 degree transmission line having three switches spaced 90 degrees apart. Two coupled line circuits are connected to the transmission line. The coupled line circuits are placed in parallel and each of the coupled line circuits selectively provides either 50 Ohms or 70.7 Ohms impedance.

DETAILED DESCRIPTION OF THE INVENTION

While the claimed invention is described below with reference to RF power amplifiers, a practitioner in the art will recognize the principles of the claimed invention are applicable elsewhere. In the following description, it is assumed that all amplifier outputs are equal in magnitude and have the same phase. The system supports any combination of one to four amplifiers in any possible combination of amplifier positions. Additionally, the system must be able to reconfigure to maintain optimum performance when one or more amplifiers fail to operate. The system acts as a piece of 50 Ohm transmission line, a two way combiner, a three way combiner or a four way combiner with the inputs being able to connect to any available combination of amplifier locations.

Figure 1:
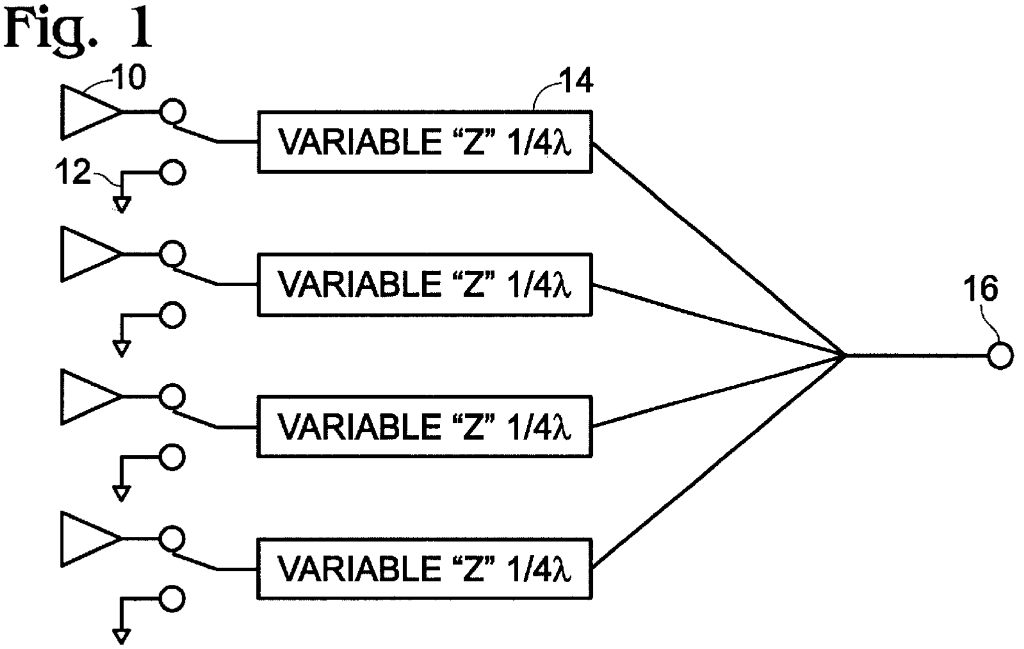
FIG. 1 is a schematic of a dynamic combination circuit.

Referring now to FIG. 1, there is depicted a theoretical solution to the problem of dynamic combining. The circuit includes four amplifiers 10 that can be switched out to ground at a switch 12. The combination mechanism in this embodiment will be ¼ λ transmission line transformers 14 connected at a common point 16. The optimum impedance for the specific configuration of the number of amplifiers involved has been calculated. For example, when a single amplifier is installed, a length of 50 Ohm transmission line is required. For two amplifiers, two ¼ λ70.7 Ohm transmission lines are required. In the case of three amplifiers, three ¼ λ86.6 Ohm transmission lines are required. And in the case of four amplifiers, four ¼ λ100 Ohm transmission lines are required. In this configuration, the impedance of the four transmission lines must be able to change between 50 Ohm, 70.7 Ohm, 86.6 Ohm and 100 Ohm depending on the current amplifier configuration. In the configuration depicted in FIG. 1, when all four amplifiers 10 are installed, each of the transmission line impedances 14 will be set to 100 Ohms and all amplifiers 10 will be switched in. When three amplifiers are active, one of the transmission lines is switched to ground at the end where the inactive amplifier is located and the remaining three transmission line impedances are set to 86.6. Ohms. The transmission line connected to the inactive amplifier is set to 100 Ohms. When two amplifiers are active, two of the transmission lines are switched to ground at the end where the inactive amplifiers are located and the remaining two transmission line impedances are set to 70.7 Ohms. The two transmission lines connected to the inactive amplifiers are set to 100 Ohms. Finally, when only one amplifier is active, three of the transmission lines are switched to ground at the end where the inactive amplifiers are located and the remaining transmission line impedance is set to 50 Ohms. The three transmission lines connected to the inactive amplifiers are set to 100 Ohms. With two amplifiers active, two transmission lines are grounded. Finally, with only one amplifier active, three transmission lines are grounded.

Although the configuration depicted in FIG. 1 represents a viable design, the grounded transmission lines 14 present an open at the common point 16 but only at the frequency for which the lines have an electrical length of ¼ λ. At other frequencies, it is some other impedance that is reflected. This will have the effect of limiting bandwith and the bandwith will continue to be reduced as the number of grounded ¼ λ transmission lines connected to the common point increases. The problem facing the designer of the system is how to vary the impedance of the transmission lines while maintaining ¼ λ length.

Figure 2:
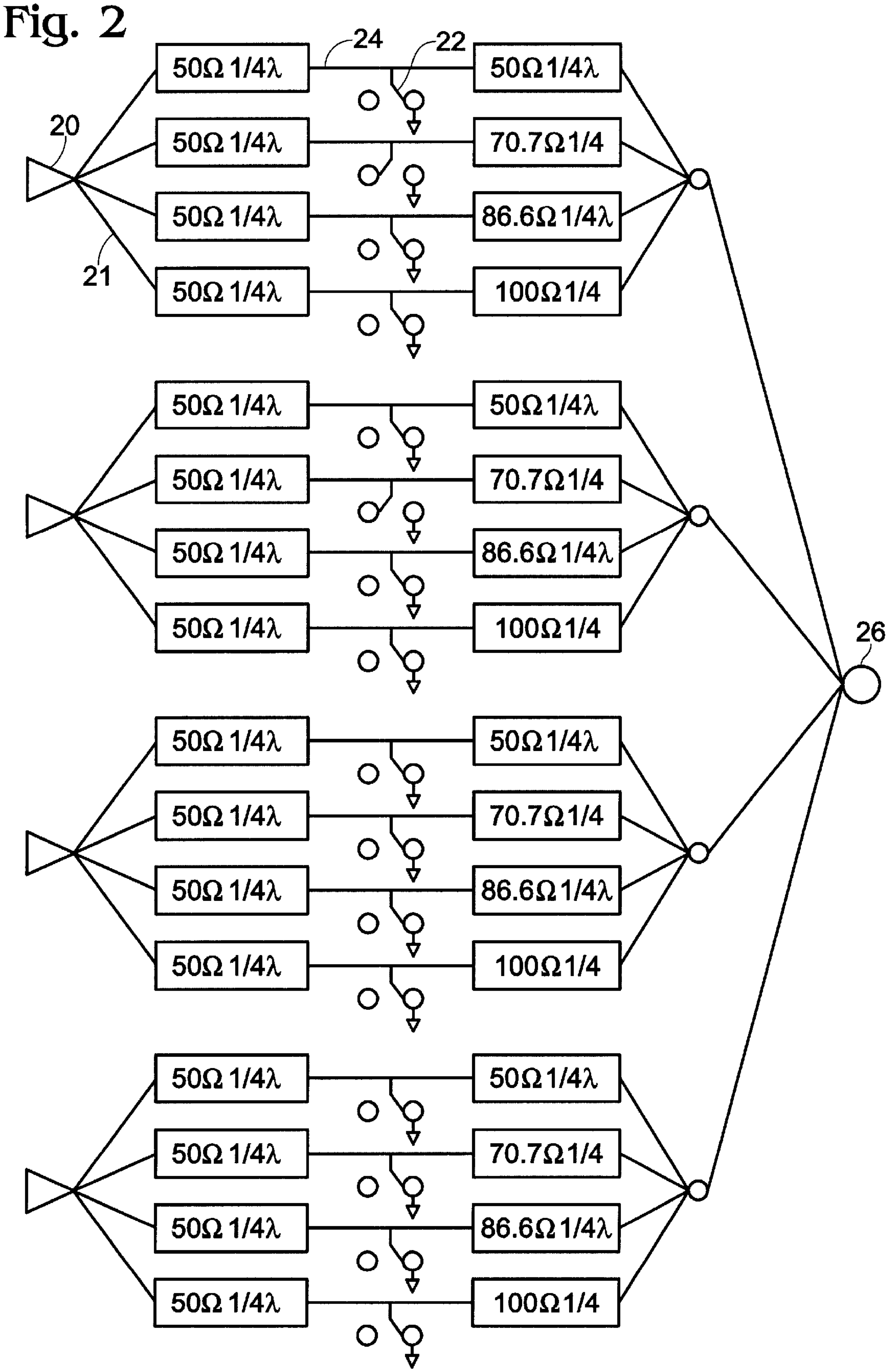
FIG. 2 is a schematic of a dynamic combination circuit of one embodiment of the present invention.

Referring now to FIG. 2, there is shown an additional solution to the problem of dynamic combining. In this embodiment, many transmission lines 24 are provided to be switched in and out at a switch 22 to provide the desired network. Each amplifier 20 has available four different paths 21 to the common point 26 of the network. Only one path at a time will be selected and which path is selected will be based upon how many amplifiers are active. For example, if two amplifiers are active, the 70.7 Ohm paths will be selected. If three amplifiers are active, the 86.6 Ohm paths will be selected. To select a path, the switch in the path will be set to the open position. All other paths will have the switch position set for a short. A 50 Ohm transmission line has been added to each path. This is required to present an open circuit to the amplifier output on the 3 paths that are not selected. When the switch position in a path is set to a short, that short reflects back as an open to both the amplifier output and the common port. Consequently, each active amplifier has three shorted ¼ λ transmission lines attached to the output. Similar to the network described in FIG. 1, this configuration will affect the impedance at frequencies other than where the transmission lines are ¼ λ. As a result, there is a bandwith limiting effect of many shorted ¼ λ transmission lines connected to the common port.

Figure 3:
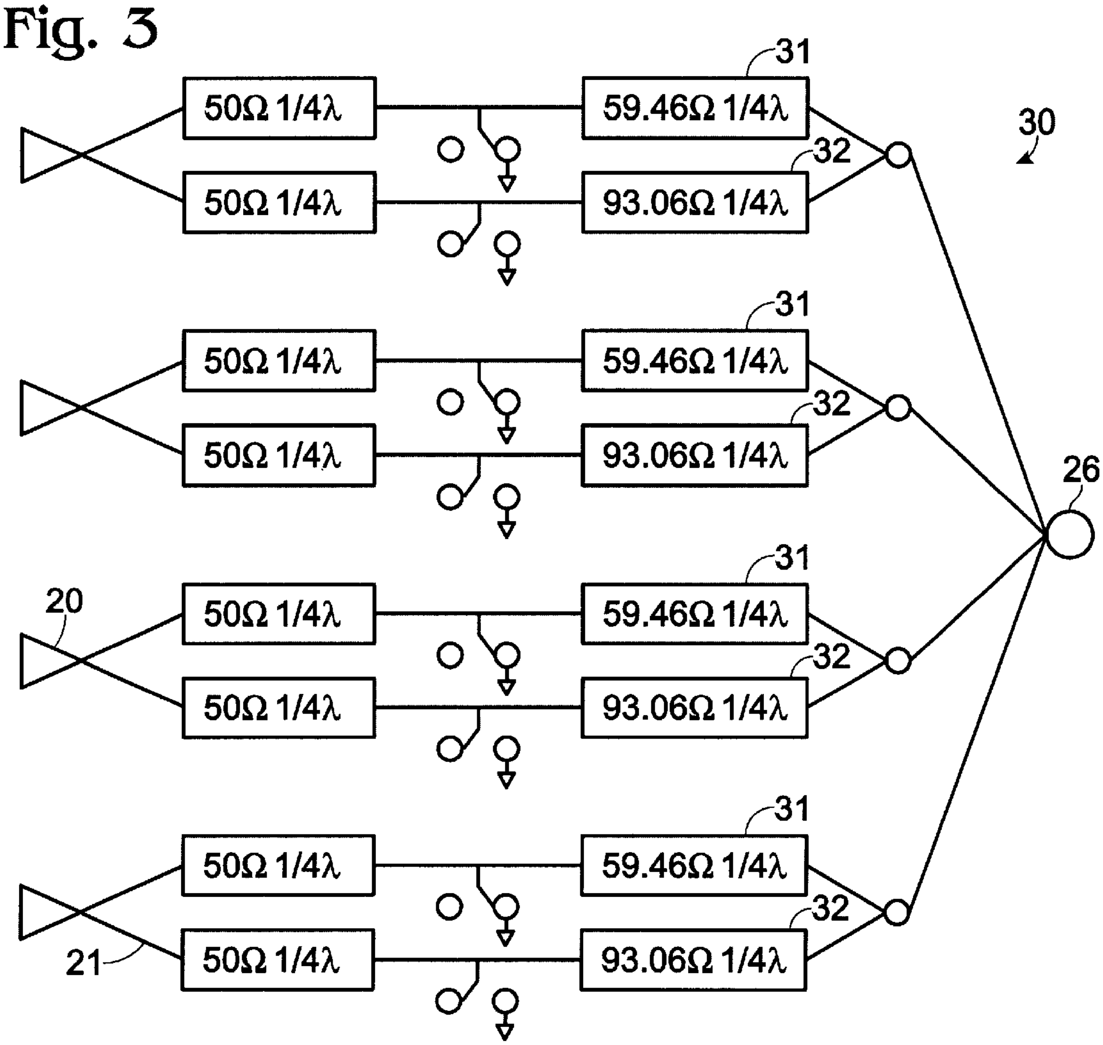
FIG. 3 is a schematic of a dynamic combination circuit of another embodiment of the present invention.

Referring now to FIG. 3, there is shown a schematic of a network employing another embodiment of the present invention. In this embodiment, the 50 Ohm and 70.7 Ohm transformers that are depicted in FIG. 2 are combined and replaced with a single transformer 31. The impedance of this new transformer 31 is calculated as the geometric mean of these values and equals 59.46 Ohms. Calculations have confirmed that this value is the best balance and results in minimum performance degradation. Furthermore the 86.6 Ohm and 100 Ohm transformers are combined and replaced with a single transformer 32. The impedance of this new transformer 32 is calculated as the geometric mean of these values and equals 93.06 Ohms. Calculations also confirm that this value is the best balance and results in minimum performance degradation. The operation of this circuit is the same as the circuit discussed in FIG. 2 except that there are only two different values of transformer impedance to choose from. This embodiment provides reduced complexity of the network.

Figure 4B:
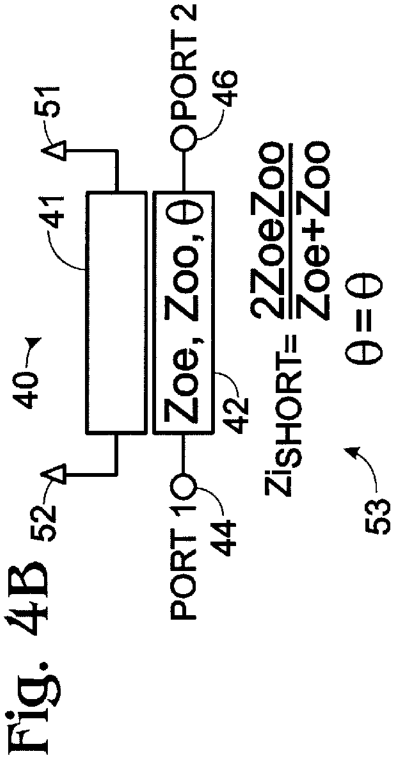
FIG. 4B is a schematic of a coupled line structure in a grounded state.
Figure 4A:
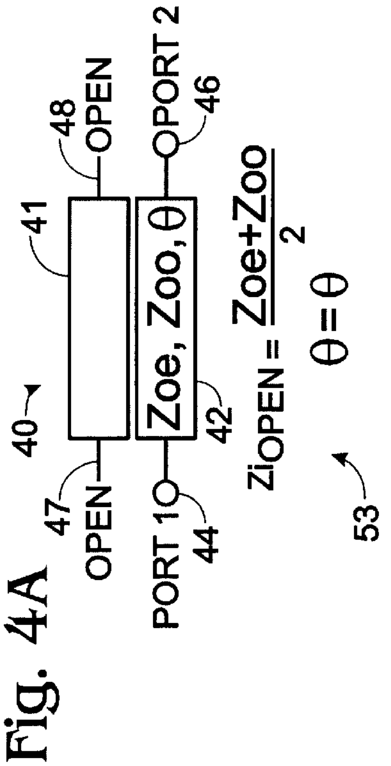
FIG. 4A is a schematic of a coupled line structure in an open state.

FIG. 4A and FIG. 4B show a component of the solution to the problem of dynamic power combining. The solution includes the use of a hybrid of the circuit shown in FIG. 3 combined with the use of coupled lines. A coupled line circuit 53 includes transmission line 41 with a first port 47 and a second port 48, and transmission line 42 with a third port 44 and a fourth port 46. The first port 47 and the second port 48 are an open circuit. The coupled line circuit in the shorted condition includes transmission line 42 with a first port 44 and a second open port 46, and transmission line 41 with a third port 51 and a fourth port 52 wherein the first port 51 and the second port 52 are a short circuit. The coupled line circuit 53 as configured in FIG. 4A and FIG. 4B will act as a piece of transmission line which can take on two different values of characteristic impedance simply by switching between opens (FIG. 4A) and shorts (FIG. 4B). These different values are referred to as image impedances of the coupled line circuit.

The coupled line circuit as shown in FIG. 4A and FIG. 4B acts as a piece of transmission line that takes on two different values of image impedance by switching between open and short circuits. The geometric means calculation used in the analysis of the circuit in FIG. 3 yielded two impedances of 59.46 Ohms and 93.06 Ohms. The next step is to set $Zi_{open}$=93.06 Ohms and $Zi_{short}$=59.46 Ohms. Then Zoe and Zoo, the values required to produce the image impedance, are calculated using the following two equations and two unknowns:

$$Zi_{open}=(Zoe+Zoo)/2=93.06$$

$$Zi_{short}=(2\times Zoe\times Zoo)/(Zoe+Zoo)=59.46$$

Consequently Zoe=148.98 Ohms and Zoo=37.14 Ohms.

Figure 5:
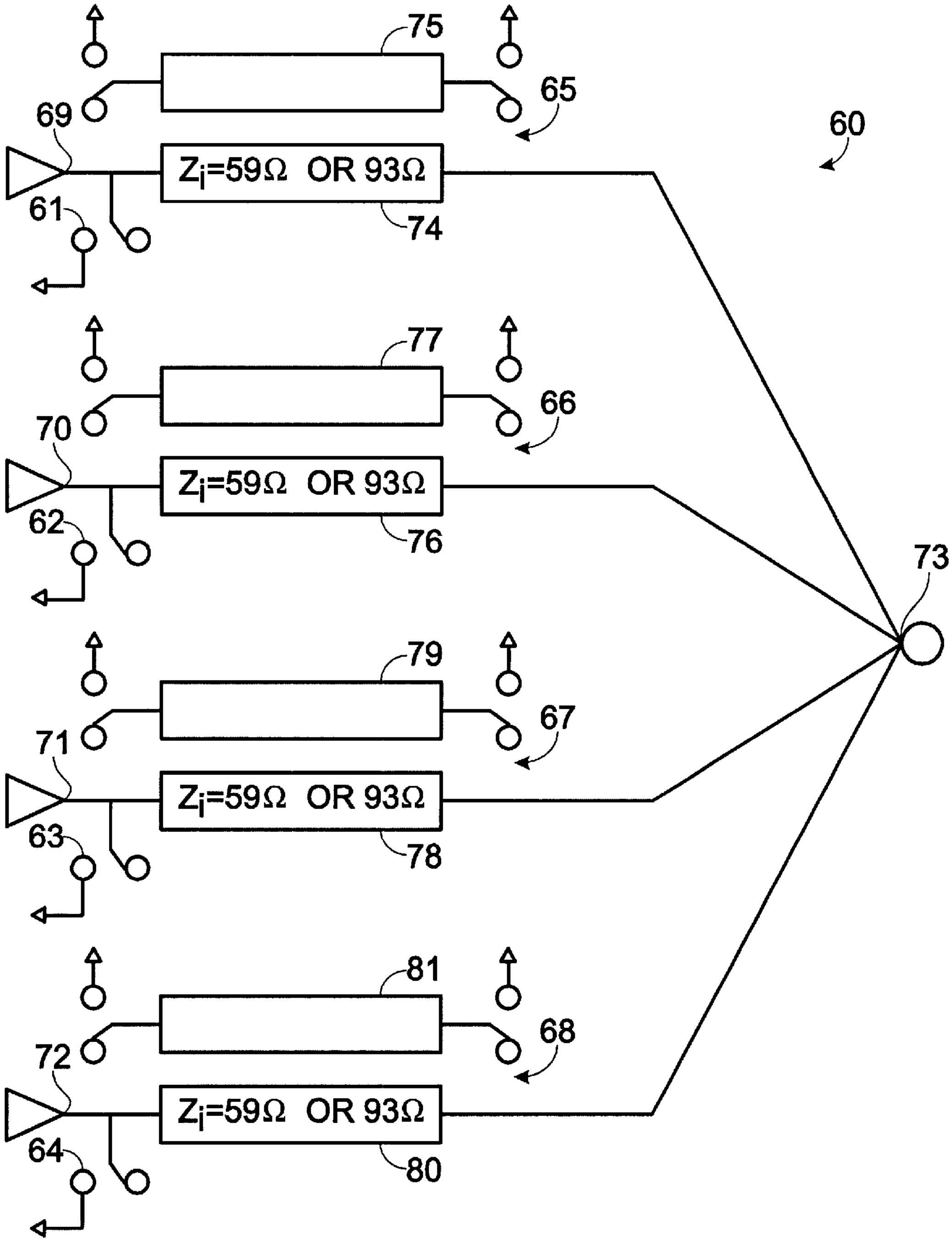
FIG. 5 is a schematic of a dynamic combination circuit of another embodiment of the present invention.

Referring now to FIG. 5, the implementation circuit, equivalent to FIG. 1, requires building four coupled line circuits using the calculated values for Zoe and Zoo. In apparatus 60 the first switch 61 is connected at a first amplifier output port 69 and the second switch 62 is connected at a second amplifier output port 70. Also, the third switch 63 is connected at a third amplifier output port 71 and the fourth switch 64 is connected at a fourth amplifier output port 72. Four couplers are installed as a first image circuit 65, a second image circuit 66, a third image circuit 67, and a fourth image circuit 68. The first switch 61, the second switch 62, the third switch 63, and the fourth switch 64 provide an open or short circuit. These switches are set to the open position at locations where there is an active amplifier installed.

At locations where amplifiers are not installed, or if an amplifier fails, the switch is set to present a short circuit. This short circuit reflects back through the quarter-wave transmission line as an open circuit at the common port 73. The impedance of a line can be set at either 59.46 Ohms or 93.06 Ohms depending upon whether the corresponding switch is an open or shorted circuit. For example, paths that are not in use are set at 93.06 Ohms. This reduces the bandwidth limiting properties of the shorted quarter-wave transmission lines that are connected to the common port 73. In FIG. 5, the image couplers provide a way to switch the impedance of a line from 59.46 Ohms impedance to 93.06 Ohms impedance. Ideally, each of the four transmission lines should switch between four different impedances to handle the four different combining situations.

Referring now to FIGS. 6A–6D, there is shown an equivalent circuit representation of the preferred impedances when one to four input ports are configured in parallel. In the case where one port only is used, the circuit is equivalent to FIG. 6A. Zin is equal to 50 Ohms and the image impedance of the selected coupled line circuit is also equal to 50 Ohms. This is accomplished in FIG. 7 by switching out one of the coupled line circuits 176, 177. To do this, three switches are placed along a 360 degree transmission line (188, that connects junctions 185 and 186) spaced 90 degrees apart. Two of the three switches will be activated so as to provide proper reflections at the two injunctions i.e., an open at 185 and a short at 186 if port one 180 or port two 182 is active. All non-active ports are terminated in short circuits.

Figure 6A:
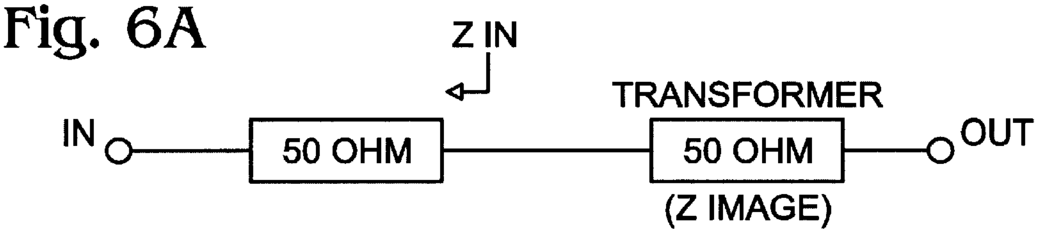
FIG. 6A is a schematic of an equivalent circuit depicting a one port condition.
Figure 6B:
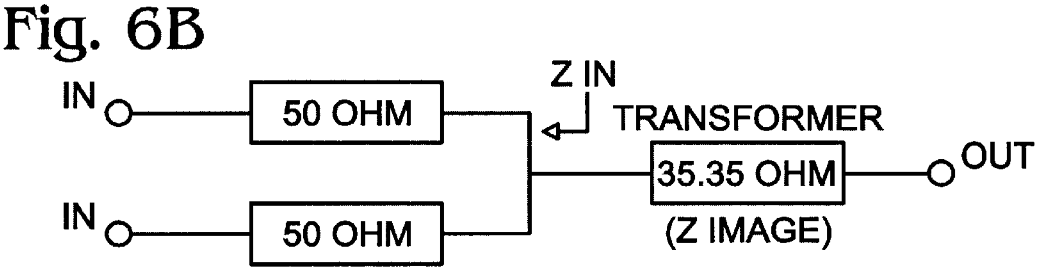
FIG. 6B is a schematic of an equivalent circuit depicting a two port condition.

In the case where two ports are active, the circuit is equivalent to FIG. 6B. Zin is equal to 25 Ohms and the parallel image impedance is equal to 35.35 Ohms. This is accomplished in FIG. 7 by opening all three switches along 360 degree transmission line 188 and utilizing the 360 degree transmission line 188 to place the two coupled line circuits parallel and setting the image impedance of each to 70.7 Ohms. All no-active port are terminated in short circuits.

Figure 6C:
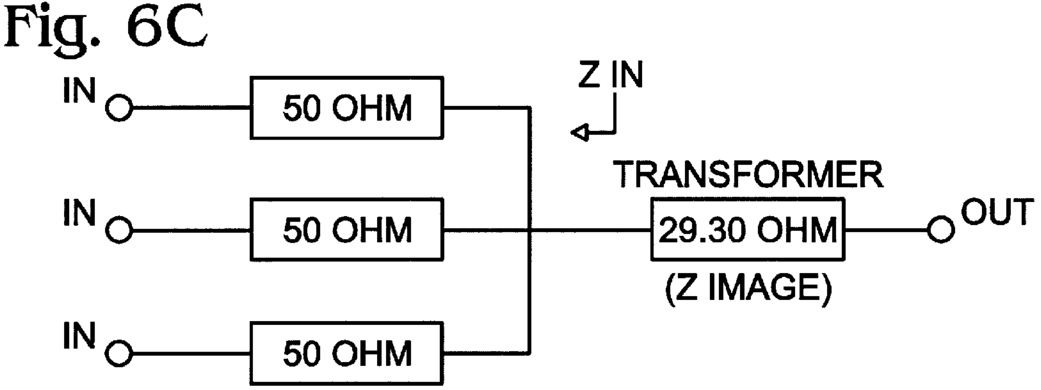
FIG. 6C is a schematic of an equivalent circuit depicting a three port condition.

In the case where three ports are active, the circuit is equivalent to FIG. 6C. Zin is equal to 16.7 Ohms and the parallel image impedance is equal to 29.3 Ohms. This is accomplished in FIG. 7 by opening all three switches along 360 degree transmission line 188 and utilizing the 360 degree transmission line 188 to place the two couple line circuits in parallel and setting one of the image impedances to 70.7 Ohms and the other to 50 Ohms. All non-active ports are terminated in short circuits.

Figure 6D:
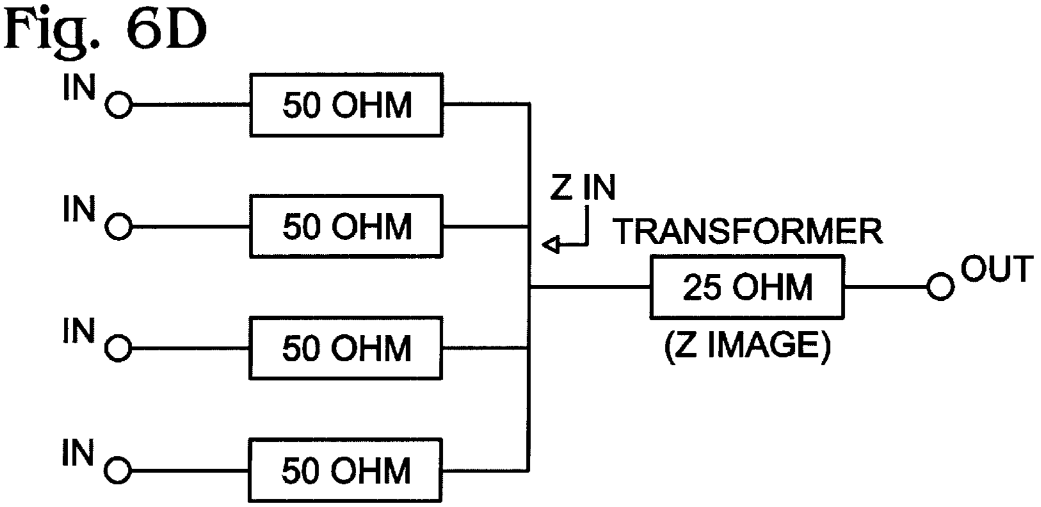
FIG. 6D is a schematic of an equivalent circuit depicting a four port condition.

In the case where four ports are active, the circuit is equivalent to FIG. 6D. Zin is equal to 12.5 Ohms and the parallel image impedance is equal to 25 Ohms. This is accomplished in FIG. 7 by opening all three switches along 360 degree transmission line 188 and utilizing the 360 degree transmission line 188 to place the two coupled line circuits in parallel and setting the image impedance of each to 50 Ohms.

Figure 7:
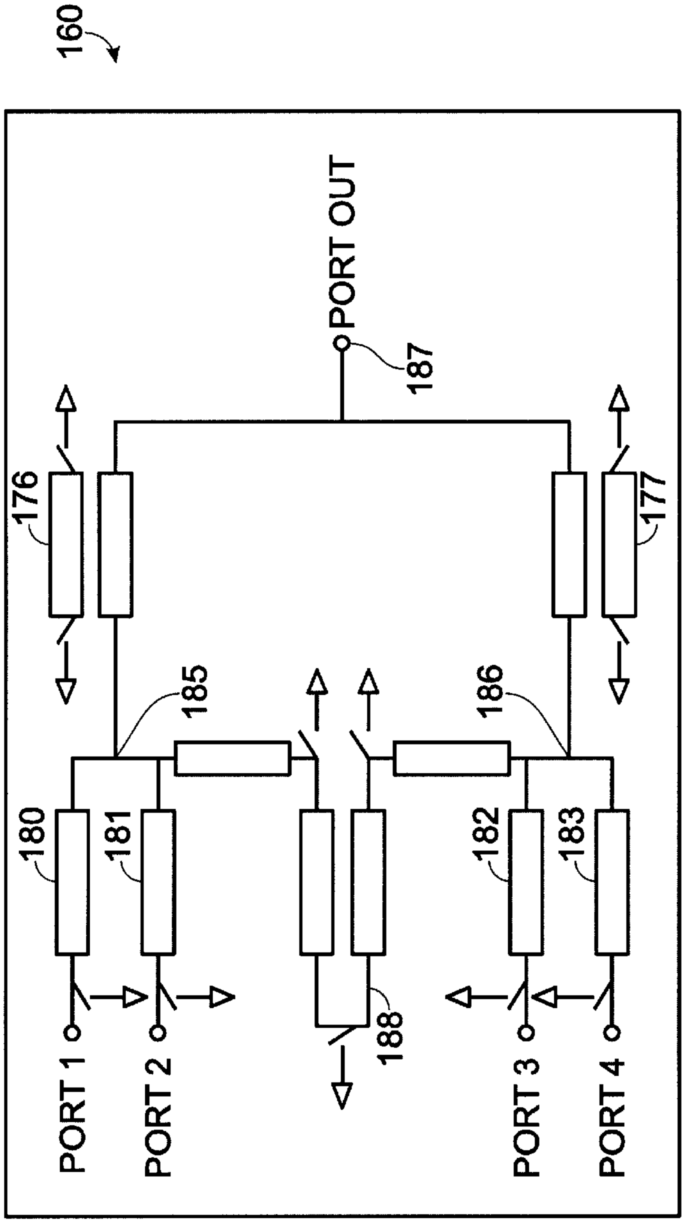
FIG. 7 is a schematic of a dynamic combination circuit of the preferred embodiment of the present invention.

FIG. 7 shows a schematic of apparatus 160 which is the preferred embodiment of the invention. This circuit provides four different impedances by using only two identical coupled line circuits placed in parallel. This is accomplished by incorporating the two identical coupled line circuits in parallel with each other in a location that is electrically common to the input ports. Calculating the optimal transform requirements leads to total Zimage required (total impedance), which leads to the optimal impedances for the image couplers of a coupler that switches between 50 Ohms and 70.7 Ohms as can be seen in Table 1:

TABLE 1

| Condition | 1st Coupler Image Impedance | 2nd Coupler Image Impedance | Parallel Combination |
|---|---|---|---|
| 1-port | 50 Ohms | 50 Ohms | 50 Ohms |
| 2-port | 70.7 Ohms | 70.7 Ohms | 35.35 Ohms |
| 3-port | 70.7 Ohms | 50 Ohms | 29.3 Ohms |
| 4-port | 50 Ohms | 50 Ohms | 25 Ohms |

In Table 1, in the case where only 1-port is used one of the coupled line circuits is switched out of the circuit.

The present preferred embodiment of the invention power combiner/splitter apparatus 160 further provides a control means (not shown) coupled to all its switches for controlling their respective switch positions. The control means is adaptable to receive bias voltages, logic signals or telemetry data for controlling the respective switch positions. The switches can be PIN diodes, mechanical switches, or any other switching means known to those skilled in the art.

While there has been illustrated and described what is at present considered to be the preferred embodiment of the claimed invention, it will be appreciated that numerous changes and modifications are likely to occur to those skilled in the art. It is intended in the appended claims to cover all those changes and modifications that fall within the spirit and scope of the present invention. For instance, the number of possible impedance values possible with apparatus 160 can vary. One skilled in the art would recognize that using two different image circuits in the design could provide additional impedance values higher than four, as described in the preferred embodiment. As is true for power combiners/splitters, the present invention serves either as a power combiner or power splitter depending on the choice of ports for the input(s) and output(s). The preferred fabrication technique for the dynamic combiner is a strip line device. Alternate fabrication techniques include, but are not limited to, micro-strip or coaxial wire lines.

What is claimed is:

1. A circuit for dynamically combining power amplifier outputs, said circuit comprising:

four power input ports;

an output port; and, four transformers, each of said transformers connected to one of said power input ports, each of said four transformers providing four separate paths to said output port, each of said four paths having a switch to ground, said four paths having impedances of approximately 50 Ohms, 70.7 Ohms, 86.8 Ohms and 100 Ohms, wherein in the condition of one of said power input ports being active, said transformer connected to said active input port selectively provides 50 Ohms impedance, and wherein in the condition of two of said power input ports being active, each of said transformers connected to said active input ports selectively provide 70.7 Ohms impedance, and wherein in the condition of three of said power input ports being active, each of said transformers connected to said active input ports selectively provide 86.6 Ohms impedance, and wherein in the condition of four of said power input ports being active, each of said transformers connected to said active input ports selectively provide 100 Ohms impedance.

2. A circuit for dynamically combining power amplifier outputs, said circuit comprising:

four power input ports;

an output port; and, four transformers, each of said transformers connected to one of said power input ports, each of said four transformers providing two separate paths to said output port, each of said two paths having a switch to ground, said two paths having impedances of approximately 59.46 Ohms and 93.06 Ohms, wherein in the condition of one or two of said power input ports being active, said transformers connected to said active input ports selectively provide 59.46 Ohms impedance, and wherein in the condition of three or four of said power input ports being active, each of said transformers connected to said active input ports selectively provide 93.06 Ohms impedance.

3. A circuit for dynamically combining/splitting power amplifier outputs, said circuit comprising:

four power input ports, each of said input ports including a switch to ground;

an output port; and, four coupled line circuits, each of said coupled line circuits acting as a piece of transmission line from one of said power input ports to said output port, each of said coupled line circuits selectively providing either 59.46 Ohms or 93.06 Ohms impedance, wherein in the condition of one or two of said power input ports being active, said transmission lines connected to said active input ports selectively provide 59.46 Ohms impedance, and wherein in the condition of three or four of said power input ports being active, each of said transmission lines connected to said active input ports selectively provide 93.06 Ohms impedance.

4. A circuit for dynamically combining/splitting power amplifier outputs, said circuit comprising:

four power input ports, each of said input ports including a switch to ground, each of said four input ports connected to a ¼λ 50 Ohms transmission line, said ¼λ 50 Ohms transmission line connected in pairs to a 360 degree transmission line, said 360 degree transmission line having three switches spaced 90 degrees apart; and two coupled line circuits connected to said 360 degree transmission line, said two coupled line circuits placed in parallel with each other, each of the coupled line circuits selectively providing either 50 Ohms or 70.7 Ohms impedance, wherein in the condition of one of said power input ports being active, one of said coupled line circuits provides 50 Ohms impedance while the other is switched out of the circuit, wherein in the condition of two of said power input ports being active, both of said coupled line circuits provide 70.7 Ohms impedance, wherein in the condition of three of said power input ports being active, one of said coupled line circuits provides 70.7 Ohms impedance and the other of said coupled line circuits provides 50 Ohms impedance, and wherein in the condition of four of said power input ports being active, both of said coupled line circuits provide 50 Ohms impedance.

* * * * *